United States Patent [19]

Lin et al.

[11] Patent Number: 5,223,373
[45] Date of Patent: Jun. 29, 1993

[54] POSITIVE WORKING PHOTOSENSITIVE COMPOSITION AND PHOTOSENSITIVE ELECTRODEPOSITION COMPOSITION PREPARED THEREFROM

[75] Inventors: Hsien-Kuang Lin, Taipei; Jim-Chyuan Shieh, Miao Li Hsien, both of Taiwan

[73] Assignee: Industrial Technology Research Institute, Taiwan

[21] Appl. No.: 692,536

[22] Filed: Apr. 29, 1991

[51] Int. Cl.⁵ .................... G03F 7/023; G03F 7/32; C08F 283/04
[52] U.S. Cl. ..................... 430/190; 430/165; 430/191; 430/192; 430/193; 430/326; 534/557; 525/459
[58] Field of Search .............. 430/190, 191, 192, 193, 430/165, 326; 534/556, 557; 525/459

[56] References Cited

U.S. PATENT DOCUMENTS

| | | | |
|---|---|---|---|
| 3,660,097 | 5/1972 | Mainthia | 430/190 |
| 3,902,906 | 9/1975 | Iwama et al. | 430/190 |
| 4,238,594 | 12/1980 | Pampouchidis | 525/459 |
| 4,673,458 | 6/1987 | Ishikawa et al. | 430/313 |
| 4,681,923 | 7/1987 | Demmer et al. | 430/190 |
| 4,898,803 | 2/1990 | Aoai et al. | 430/190 |
| 4,975,351 | 12/1990 | Akaki et al. | 430/190 |
| 5,080,998 | 1/1992 | Irving et al. | 430/190 |

FOREIGN PATENT DOCUMENTS

| | | |
|---|---|---|
| 0265387 | 4/1988 | European Pat. Off. |
| 63-297473 | 12/1988 | Japan . |
| 64-4672 | 1/1989 | Japan . |
| 64-90270 | 4/1989 | Japan . |

*Primary Examiner*—Charles L. Bowers, Jr.
*Assistant Examiner*—John S. Chu
*Attorney, Agent, or Firm*—Spencer, Frank & Schneider

[57] ABSTRACT

Disclosed is a photosensitive quinone diazide compound for the preparation of a two component positive working photosensitive electrodeposition composition. As the photosensitive group is grafted on a polyurethane, the photosensitive compound thus synthesized has good flexibility and good compatability with acrylic resin. The electrodeposition composition also has good adhesion to the metal base plate when it is coated thereon by electrodeposition means.

16 Claims, No Drawings

POSITIVE WORKING PHOTOSENSITIVE COMPOSITION AND PHOTOSENSITIVE ELECTRODEPOSITION COMPOSITION PREPARED THEREFROM

BACKGROUND OF THE INVENTION

The present invention relates to a photosensitive quinone diazide compound, and in particular to a positive working photosensitive composition as well as an electrodeposition composition containing this quinone diazide compound used for the preparation of a printed circuit board.

In the production of a printed circuit board wherein a positive working photoresist is used, it is known that a problem of relatively poor adhesion of the photosensitive resin to the base plate exists. This problem of poor adhesion can be improved by the adoption of an electrodeposition technique. In the electrodeposition technique, the electrodeposition coating used is a water soluble emulsion, and the components of the coating are suspended in the water in particulate form. As electrostatic repellent forces exist between these particulates, they will not precipitate during the electrodeposition operation. The electrodeposition coating can be divided into anionic electrodeposition coatings and cationic electrodeposition coatings according to the electrical properties of the emulsified particulates. In the anionic electrodeposition coating, the carboxy groups of the polymer neutralize the small molecular amines (which are neutralizing agents) to form a negatively charged polymer, while in the cationic electrodeposition coating, the amine groups of the polymer neutralize the small molecular acid (which is a neutralizing agent) to form a positively charged polymer. Upon the application of electricity, the charge carrying polymer and the small molecular neutralizing agent will move to anode and cathode so that the anionic polymer deposits on the anode due to loss of ionic properties by contacting hydrogen ions and the cationic polymer deposits on the cathode due to being reduced by hydroxy ions.

Conventionally used photosensitive compounds for positive working photoresists are quinone diazides. These photosensitive compounds can be grafted on the charge carrying polymers (one component system), or can be separated from the charge carrying polymers (multicomponent system) when the electrodeposition technique is used for the coating. Japan laid-open patent No. 63-297473 discloses a photosensitive composition containing quinone diazide group bearing maleic copolymers. Japan laid-open patents No. 64-4672, No. 64-90270 and U.S. Pat. No. 4,673,458 disclose photosensitive compositions containing quinone diazide bearing acrylic copolymers. And U.S. Pat. No. 4,681,923 discloses a quinone diazide group bearing modified phenolic novolak resin. All of the above mentioned photosensitive compositions belong to the one component electrodeposition coating system. As the groups of the above-mentioned photosensitive compositions are grafted on the charge carrying polymer, this results in a diminution of the flexibility of the compositions. Therefore, during the process of electrodeposition, pin holes form on the coating. Furthermore, the photosensitivity of the photosensitive groups is reduced after they are grafted on the polymer.

It is known that the photosensitivity of the photosensitive groups can be improved if the photosensitive groups are not grafted on the charge carrying polymers. For example, European Patent No. 0265387 discloses a photosensitive mixture which includes a photosensitive compound prepared by grafting quinone diazides on 2,4-dihydroxybenzophenone or 2,3,4-trihydroxybenzophenone, and a charge carrying acrylic resin or phenoic novolak resin. Although the photosensitivity of the photosensitive groups is improved, the photosensitive compounds have a poor solubility to the solvent used for the preparation of electro-deposition solution, and their compatability with the charge carrying polymers is also not satisfactory. Therefore, precipitation is formed in the electrodeposition solution during the electrodeposition process and pin holes are also formed on the resultant coating layer.

SUMMARY OF THE INVENTION

It is therefore an object of the present invention to provide a photosensitive composition having better photosensitivity and flexibility, that is suitable for application to a base plate by an electrodeposition means.

It is another object of the present invention to provide a photosensitive electrodeposition composition which will not precipitate during the electrodeposition process.

In order to achieve the objects stated above, the photosensitive composition of the present invention comprises two components, one component is a photosensitive compound which involves photosensitive quinone diazide groups being grafted on a polyurethane, and the other component is a charge carrying acrylic resin. This photosensitive composition is dispersed in water in the form of an emulsion. As the photosensitive group, i.e. the quinone diazide group is grafted on a polyurethane, the resulting quinone diazide compounds demonstrate as good flexibility as the polyurethane, and as the molecular weight of the resulting quinone diazide compound is increased, its compatibility with the acrylic resin is improved. Accordingly, no pinholes are formed in the resulting electrodeposition film and the stability of the electrodeposition bath is improved by using the electrodeposition composition of the present invention.

DETAILED DESCRIPTION OF THE INVENTION

Suitable acrylic resins used in the electrodeposition composition of the present invention are polymerization products of carboxyl bearing acrylic monomers with other unsaturated monomers. The carboxy groups of the acrylic resin are neutralized by small molecular amines, which are essential components of the electrodeposition composition of the present invention and will be described hereinafter, so as to make the acrylic resin form an anionic polymer. The carboxy bearing monomers include: methacrylic acid, acrylic acid, phthalic acid (meth)acrylate, succinic acid (meth)acrylate, cinnamic acid, crotonic acid, maleic acid, beta-carboxyethyl (meth)acrylate and the like. Unsaturated monomers include: hydroxy bearing monomers such as hydroxyethyl (meth)acrylate, alkyl (meth)acrylate such as methyl (meth)acrylate, butyl (meth)acrylate, amide bearing monomers such as methyl acrylamide, nitrile bearing monomers such as acrylonitrile, amino bearing monomers such as N,N-dimethylamino ethyl (meth)acrylate, N,N-diethylamino ethyl (meth)acrylate, aromatic bearing monomers such as benzyl acrylate, phenoxy acrylate and the like. The above-mentioned unsaturated monomers can be used independently or mixed with the carboxy bearing acrylic monomers to synthesize a copolymer.

In order to stabilize the emulsion solution, the amount of the carboxy bearing acrylic monomers should constitute 3-30 wt % of the total amount of these two monomers, while the unsaturated monomers should constitute 97-70 wt % of the total amount. The acrylic resins are synthesized by a radical polymerization reaction; and the method for this synthesis can be a solution polymerization, a suspension polymerization or an emulsion polymerization. The average molecular weight of the acrylic resin used in the present invention should be in the range of 2500-200,000.

The photosensitive compounds of the present invention are those which have their photosensitive groups, quinone diazide, grafted on a polyurethane. Upon exposure to ultra-violet rays, said quinone diazide groups will be subject to chemical reaction to remove the nitrogen molecules and form carboxyl groups. These carboxyl groups will promote the solubility of the photosensitive compositions to the alkaline developing solution so as to produce patterns on the photoresist.

The photosensitive quinone diazide compounds used in the photosensitive composition of the invention are those of the formula:

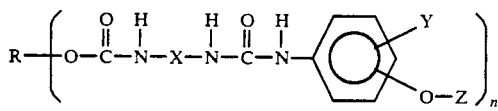

wherein

R is a polyester or polyether having a molecular weight of 100 to 1000;

X is a divalent aliphatic or aromatic free radical such as

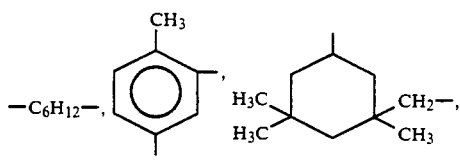

Y is —H, —OH, alkyl, —COOH, —NO$_2$ or halogen atoms;

Z is a group selected from the groups consisting of —H,

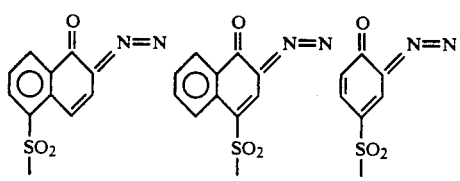

and at least one Z is selected from the group of

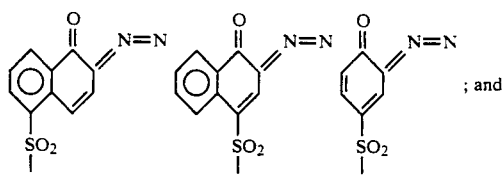

n is 2 or 3.

These photosensitive quinone diazide compounds are reaction products of isocyanates, aminophenolic compounds and 1,2-quinone diazide sulfonyl halides. In the reaction, the isocyanates react with aminophenolic compounds first, and as the selectivity of the isocyanates to amino groups is far higher than it is to the hydroxyl group of the aminophenolic compounds, the hydroxyl groups of the aminophenolic compounds can be retained till the addition of 1,2-quinone diazide sulfonyl halides to react with the sulfonyl halide group and thereby introduce the quinone diazides into isocyanates.

Polyisocyanates may be prepared by reacting polyhydroxy compounds with diisocyanates. Suitable polyhydoxy compounds are those having a hydroxy equivalent between 50-500 gram/hydroxy equivalent, for example: triethylene glycol, tetraethylene glycol, polyethylene glycol, polypropylene glycol, polyester diol, polytetrahydrofuran, polycaprolactone, ethoxylated trimethylolpropane or propoxylatd trimethylolpropane. Suitable diisocyanates are hexamethylene diisocyanate, toluene diisocyanate, isophorone diisocyanates, diphenyl methane diisocyanate or xylylene diisocyanate and the like. Among them, particular preference is given to the compounds in which the two isocyanates have different activity such as toluene diisocyanate and isophorone diisocyanate. In the reaction of polyhydroxy compounds and diisocyanates, usually the equivalent ratio of the hydroxy group to isocyanate is controlled in the range of 1.25-1:1, and preferably the polyhydroxy compounds are added into the diisocyanates dropwise.

The aminophenolic compounds used in this reaction are those of the formula:

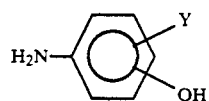

wherein Y is —H, —OH, alkyl, —COOH, nitro or halogen. Suitable aminophenolic compounds are, for example: 4-amino-m-cresol, 6-amino-m-cresol, 5-amino-o-cresol, 2-amino-p-cresol, 2-amino-4-t-butyl phenol, 2-amino-4-chlorophenol, 4-amino-2,6,-dichlorophenol, 3-amino-4-hydroxy benzolic acid, 4-amino-3-hydroxy benzolic acid, 2-amino-4-nitro phenol, 2-amino-5-nitro phenol, 4-amino-2-nitro phenol, o-amino phenol, m-amino phenol, p-aminophenol, 2-aminophenol-sulfonic acid, 3-amino salicylic acid, 5-amino salicylic acid, p-amino salicylic acid, 4-amino-2,3-xylenol or 6-amino-2,4-xylenol. In the reaction of polyisocyanates and aminophenolic compounds, the equivalent ratio of isocyanantes to amino groups is 1:0.95-1.

Suitable quinone diazide sulfonyl halides are for example: 1,2-naphthoquinone-2-diazide-5-sulfonyl chloride, 1,2-naphthoquinone-2-diazide-4-sulfonyl chloride or 1,2-benzoquinone-diazide-4-sulfonyl chloride and the like. In the reaction of aminophenolic compounds with sulfonyl chloride, the equivalent ratio of the hydroxy groups of phenolic compounds to sulfonyl chloride should be controlled in the range of 1:0.2-1.

In the electrodeposition composition, the electric charges of the emulsified particles are derived from the ions produced by the reaction of the carboxyl groups of acrylic resins and small molecular amines. Suitable small molecular amines of the present invention are of the formula: $R_3N$ wherein R is H, $C_1$-$C_3$ alkyl or $C_2$-$C_3$ alkanol, for example, ammonia, ethylamine, methylethyl amine, diethylamine, methylethanolamine, diethanolamine, methyldiethylamine, triethylamine or triethanolamine and the like. It is desirable to select those having high boiling points so as to prevent toxicity due to the evaporation of the amines.

The electrodeposition composition of the present invention is prepared by mixing the acrylic resins with the photosensitive quinone diazide compounds to obtain a mixture, and then adding the small molecular amines and deionized water dropwise to the mixture to control the pH value in the range of 7.0 to 8.0. The solid content of the mixture should be maintained in the range of 8-12 wt % and the weight ratio of acrylic resins to photosensitive quinone diazide compounds should be 1:0.2-0.83. The electrodeposition compositions prepared by this method have good flexibility and therefore after being electrodeposited onto the base plate, form a smooth coating without pinholes.

When using the electrodeposition composition of the present invention, the temperature of the electrodeposition bath should be controlled in the range of 28° C. to 30° C., and the applied electrical voltage should be in the range of 5-100 volts depending on the coating thickness. As the emulsified particles bear negative charges, the anode is connected to the plated base plate to be electrodeposited and the cathode is connected to a stainless plate. The time interval for this electrodeposition process usually varies from 30 seconds to 3 minutes depending on the size of the base plate to be electrodeposited. After a continuous film of anionic, positive working photosensitive resin composition is coated on the copper metal of the base plate, the plate is subjected to drying and other steps to form a pattern thereon.

This invention is more specifically described by the following illustrative examples:

EXAMPLE 1

Preparation of Acrylic Resin I $N_2$ gas was introduced into a four-neck reaction flask, equipped with a condenser, a feeding tube and a stirring rod, and this flask was heated to 100° C. Into this flask, 75.9 g cyclohexanone was first added, and after about 10 minutes a mixed solution of 90.0 g methyl methacrylate, 102.4 g of butyl acrylate, 78.5 g of phthalic acid acrylate and 1.5 g of N,N'-azobisisobutylnitrile was added dropwise, and the reaction was allowed to continue for 6 hours. The acrylic resin thus prepared had a molecular weight of 22,000.

EXAMPLE 2

Preparation of Acrylic Resin II $N_2$ gas was introduced into a four-neck reaction flask, equipped with a condenser, a feeding tube and a stirring rod, and this flask was heated to 100° C. Into this flask, 85.7 g of propylene glycol monomethyl ether was first added, and after about 10 minutes a mixed solution of 73.5 g methyl methacrylate, 113.5 g of butyl acrylate, 18.8 g of methacrylic acid and 2.50 g of N,N'-azobisisobutylnitrile diazobisisobutyl nitrile was added dropwise, and the reaction was allowed to continue for 6 hours. The acrylic resin thus prepared had a molecular weight of 14,000.

EXAMPLE 3

Preparation of Photosensitive Resin A

A four-neck flask, equipped with a condenser, a feeding tube and a stirring rod, was heated to 40° C. 38.3 g of 2,4-toluene diisocyanate and 50 g of acetone were added to this flask, and stirred well. Then to this, a mixed solution of 23.3 g of tetraethylene glycol, 50.0 g of acetone and 0.3 g of dibutyl tin dilaurate was added during 1 hour, and this reaction was allowed to continue for 2 hours. After cooling to room temperature, 22.0 g of o-amino phenol and 100.0 g of acetone were added, and the temperature was gradually elevated to 60° C. and maintained for 3 hours. Thereafter, the reaction flask was cooled to room temperature, 51.0 g of 1,2-naphthoquinone-2-diazide-5-sulfonyl chloride was added and stirred well. To this, 21.1 g of triethylamine and 100.0 g of acetone were added dropwise in 1 hour and the reaction was allowed to continue for 4 hours. The reaction product was poured into a 1% hydrochloric acid solution, stirred and separated to obtain a yellow brown resinous precipitate. The resulting precipitate was washed with deionized water and 125.2 g of yellow brown resin was obtained. The yield thereof was 93%.

EXAMPLE 4

Preparation of Photosensitive Resin B

A four-neck flask, equipped with a condenser, a feeding tube and a stirring rod, was heated to 40° C. Into this flask, were added 35.3 g of hexamethylene diisocyanate and 50 g of acetone, and stirred well. To this, was further added a mixing solution of 46.8 g of polypropylene glycol (molecular weight 425), 100.0 g of acetone and 0.3 g of dibutyl tin dilaurate in 1 hour, and this reaction was continued for 2 hours. After cooling to room temperature, 21.8 g of o-amino phenol and 50.0 g of acetone were added, the temperature, was gradually elevated to 60° C. and maintained for 3 hours. Thereafter, the reaction flask was cooled to room temperature, 45.6 g of 1,2-naphthoquinone-2-diazide-4-sulfonyl chloride was added and stirred well. To this 18.0 g of triethylamine and 100.0 g of acetone were added dropwise in 1 hour, and the reaction was allowed to continue for 4 hours. The reaction product was poured into a 1% hydrochloric acid solution, stirred and separated to obtain a yellow brown resinous precipitate. The resulting precipitate was washed with deionized water and 133.1 g of yellow brown resin was obtained. The yield thereof was 89%.

EXAMPLE 5

Preparation of Photosensitive Resin C

A four-neck flask, equipped with a condenser, a feeding tube and a stirring rod, was heated to 40° C. To this flask, 37.0 g of 2,4-toluene diisocyanate and 50 g of acetone were added, and stirred well. Then to this, a mixed solution of 52.6 g of aliphatic polyester diol(hydroxy equivalent 239 g/hydroxy equivalent), 100.0 g of acetone and 0.3 g of dibutyl tine dilaurate was added during 1 hour, and this reaction was allowed to continue for for 2 hours. After cooling to room temperature, 21.8 g of o-amino phenol and 50.0 g of acetone were added, and the temperature was gradually elevated to 60° C. and maintained for 3 hours. Thereafter, the reaction flask was cooled to room temperature, 51.0 g of 1,2-naphthoquinone-2-diazide-5-sulfonyl chloride was added and stirred well. To this 19.2 g of triethylamine and 100.0 g of acetone were added dropwise in 1 hour, and the reaction was allowed to continue for 4 hours. The reaction product was poured into a 1% hydrochloric acid solution, stirred and separated to obtain a yellow brown resinous precipitate. The resulting precipitate was washed with deionized water and 154.3 g of yellow brown resin was obtained. The yield thereof was 95%.

EXAMPLE 6

12.63 g of photosensitive resin A, 17.24 g of methoxy propylene glycol and 10.0 g of butoxy ethylene glycol were dissolved completely, and then 36.1 g of acrylic resin I and 3.21 g of triethylamine were added and stirred well. The mixture was diluted with 435 g of deionized water to a solid content of 8% and pH value of 7.7 to obtain an electrodeposition bath emulsion. A copper base plate was dipped into this electrodeposition bath emulsion. After connecting an anode to the base plate and applying a 10 V direct current for 30 seconds, the base plate was taken out and baked at 90° C. for 10 minutes to obtain a 4 microns photoresist film. This photoresist film was exposed to an ultra-violet radiation having an energy of 400 mj/cm², and developed with 1% sodium metasilicate. A definite photoresist pattern was formed on the copper base plate. After subjecting the plate to an etching operation with sodium persulfate at 40° C., a circuit board bearing circuit pattern was obtained. Neither peeling of the photoresist film nor pinholes were observed after this etching.

EXAMPLE 7

18.5 g of photosensitive resin B, and 21.0 g of butoxy ethylene glycol were dissolved completely, and then 41.2 g of acrylic resin II and 4.61 g of triethanol amine were added and stirred well. The mixture was diluted with 413 g of deionized water to a solid content of 10% and pH value of 7.55 to obtain an electrodeposition bath 45 emulsion. A copper base plate was dipped into this electrodeposition bath emulsion. After connecting an anode to the base plate and applying 15 V direct current for 60 seconds, the base plate was taken out and baked at 90° C. for 10 minutes to obtain a 7 microns photoresist film. This photoresist film was exposed to an ultra-violet radiation having an energy of 500 mj/cm², and developed with 1% sodium metasilicate. A definite photoresist pattern was formed on the copper base plate. After subjecting the plate to an etching operation with sodium persulfate at 40° C., a circuit board bearing circuit pattern was obtained. Neither peeling of the photoresist film nor pinholes were observed after this etching.

EXAMPLE 8

10.2 g of photosensitive resin C, and 16.3 g of methoxy propylene glycol were dissolved completely, and then 37.4 g of acrylic resin II and 2.85 g of triethyl amine were added and stirred well. The mixture was diluted with 414 g of deionized water to a solid content of 8% and pH value of 7.43 to obtain an electrodeposition bath emulsion. A copper base plate was dipped into this electrodeposition bath emulsion. After connecting an anode to the base plate and applying 10 V direct current for 60 seconds, the base plate was taken out and baked at 90° C. for 10 minutes to obtain a 5 microns photoresist film. This photoresist film was exposed to an ultra-violet radiation having an energy of 400 mj/cm², and rinsed with 1% sodium metasilicate. A definite photoresist pattern was formed on the copper base plate. After subjecting the plate to an etching operation with sodium persulfate at 40° C., a circuit board bearing circuit pattern was obtained. Neither peeling of the photoresist film nor pinholes were observed after this etching.

COMPARATIVE EXAMPLE 5.0 g of acrylic polymer was prepared from 7 mol % of methacrylic acid, 15 mol % of methyl methacrylate, 10 mol % of butyl acrylate, 18 mol % of methyl acrylate and 25 mol % of diacetone acrylamide. 1.0 g of photosensitive compound was obtained from 2,3,4-trihydroxybenzophenone and 1,2-naphthoquinone-2-diazide-4-sulfonyl chloride. 1.0 g of the above photosensitive compound, and 3.0 g of butyl cellsolve were completely dissolved, and then 5.0 g of the above acrylic polymer and triethanol amine were added and stirred well. The mixture was diluted with deionized water to a pH value of 7.5 to obtain an elecctrodeposition bath. A precipitate was formed in the resulting electrodeposition bath.

What is claimed is:

1. A photosensitive quinone diazide compound of general formula:

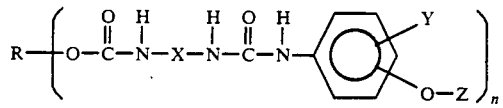

wherein

R is a polyester or polyether having a molecular weight of 100 to 1000;

X is a divalent aliphatic or aromatic free radical;

Y is —H, —OH, alkyl, —COOH, —NO₂ or halogen atoms;

Z is a group selected from the groups consisting of —H,

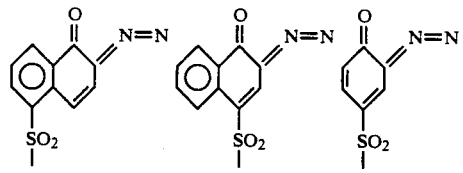

and at least one Z is selected from the group consisting of

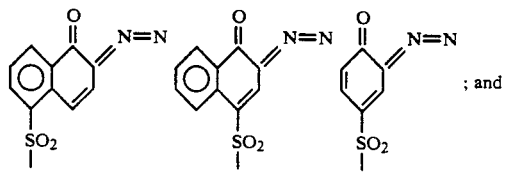

; and n is 2 or 3.

2. A photosensitive compound as claimed in claim 1, which is a reaction product of the following compounds:
   a polyisocyanate;
   an aminophenoic compound of the following formula:

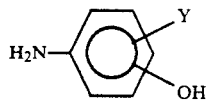

wherein Y is —H, —OH, alkyl, —COOH, nitro or halogen; and 1.2-quinone-diazide sulfonyl halide; wherein the equivalent ratio of the isocyanate to the amino groups of the amino phenoic compounds is 1:0.95–1, and the equivalent ratio of the hydroxy group of the amino phenoic compounds to the 1,2-quinone diazide sulfonyl halide is 1:0.2–1.

3. A photosensitive compound as claimed in claim 2, wherein said polyisocyanate is a reaction product of the following compounds:
   a polyhydroxy compound having a hydroxy equivalent of 50–500 gram/hydroxy equivalent; and
   a diisocyanate;
wherein the equivalent ratio of the hydroxy group of said polyhydroxy compound to said diisocyanate is 1:1–1.25.

4. A photosensitive compound as claimed in claim 3, wherein said polyhydroxy compound is selected from the group consisting of triethylene glycol, tetraethylene glycol, polyethylene glycol, polypropylene glycol, polyester diol, polytetrahydrafuran, polycaprolactone, ethoxylated trimethylolpropane or propoxylatd trimethylolpropane.

5. A photosensitive compound as claimed in claim 3, wherein said diisocyanate is selected from the group consisting of hexamethylene diisocyanate, toluene diisocyanate, isophorone diisocyanates, diphenyl methane diisocyanate or xylylene diisocyanate.

6. A photosensitive compound as claimed in claim 2, wherein said amino phenoic compound is a compound selected from the group consisting of 4-amino-m-cresol, 6-amino-m-cresol, 5-amino-o-cresol, 2-amino-p-cresol, 2-amino-4-t-butyl phenol, 2-amino-4-chlorophenol, 4-amino-2,6,-dichlorophenol, 3-amino-4-hydroxy benzolic acid, 4-amino-3-hydroxy benzolic acid, 2-amino-4-nitro phenol, 2-amino-5-nitro phenol, 4-amino-2-nitro phenol, o-amino phenol, m-amino phenol, p-amino phenol, 2-aminophenolsulfonic acid, 3-amino salicylic acid, 5-amino salicyclic acid, p-amino salicylic acid, 4-amino-2,3-xylenol and 6-amino-2,4-xylenol.

7. A photosensitive compound as claimed in claim 2, wherein said 1,2-quinone diazide sulfonyl halide is a compound selected from the group consisting of 1,2-naphthoquinone-2-diazide-5-sulfonyl chloride, 1,2-naphthoquinone-2-diazide-4-sulfonyl chloride and 1,2-benzoquinone-diazide-4-sulfonyl chloride.

8. A positive working photosensitive composition comprising:
   an acrylic resin having a weight average molecular weight in the range of 2500–200,000, which is a polymerization product of 3–30 wt % of carboxy bearing acrylic monomers and 97–70 wt % of other unsaturated monomers;
   a photosensitive quinone diazide compound of the general formula:

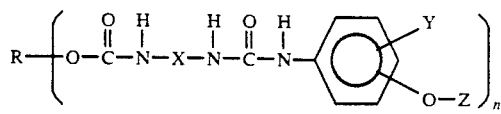

wherein
R is a polyester or polyether having a molecular weight of 100 to 1000;
X is a divalent aliphatic or aromatic free radical;
Y is —H, —OH, alkyl, —COOH, —NO$_2$ or halogen atoms;
Z is a group selected from the groups consisting of —H,

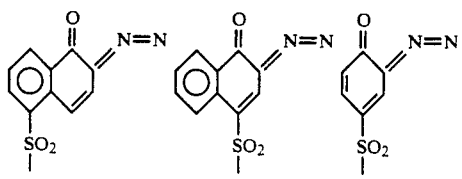

and at least one Z is selected from the group consisting of

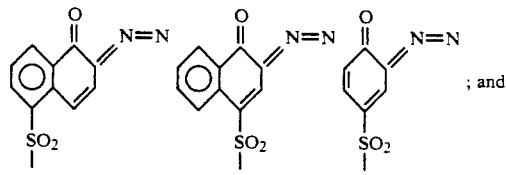

; and n is 2 or 3.

9. A positive working photosensitive composition as claimed in claim 8, wherein said carboxy bearing monomer is selected from the group consisting of methacrylic acid, acrylic acid, phthalic acid (meth)acrylate, succinic acid (meth)acrylate, cinnamic acid, crotonic acid, maleic acid, beta-carboxyethyl (meth)acrylate.

10. A positive working photosensitive composition as claimed in claim 8, wherein the weight ratio of said acrylic resin to said photosensitive quinone diazide compound is 1:0.2–0.83.

11. A positive working photosensitive composition as claimed in claim 8, wherein said photosensitive quinone diazide compound is a reaction product of the following compounds:
   a polyisocyanate;
   an aminophenoic compounds of the following formula:

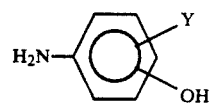

wherein Y is —H, —OH, alkyl, —COOH, nitro or halogen; and 1.2-quinone-diazide sulfonyl halide; wherein the equivalent ratio of the isocyanate to the amino groups of the amino phenoic compounds is 1:0.95–1, and the equivalent ratio of the hydroxy group of the amino phenoic compounds to the 1,2-quinone diazide sulfonyl halide is 1:0.2–1.

12. A positive working photosensitive composition as claimed in claim 8, wherein said polyisocyanate is a reaction product of the following compounds:

a polyhydroxy compound having a hydroxy equivalent of 50–500 gram/hydroxy equivalent; and a diisocyanate;

wherein the equivalent ratio of the hydroxy group of said polyhydroxy compound to said diisocyanate is 1:1–1.25.

13. A photosensitive electrodeposition composition, comprising:

a small molecular amine of the formula:

$R_3N$ wherein R is selected from the group consisting of H, $C_1$–$C_2$ alkyl and $C_2$–$C_3$ alkanol;

an acrylic resin having a weight average molecular weight of 2500–200,000 and is a reaction product of 3–30 wt % of carboxy bearing acrylic monomers and 97–70 wt % of other unsaturated monomers; and a photosensitive quinone diazide compound of the general formula:

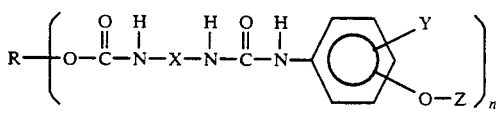

wherein

R is a polyester or polyether having a molecular weight of 100 to 1000;

X is a divalent aliphatic or aromatic free radical;

Y is —H, —OH, alkyl, —COOH, —$NO_2$ or halogen atoms;

Z is a group selected from the groups consisting of —H,

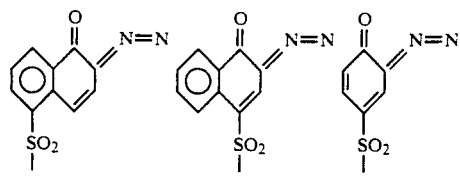

and at least one Z is selected from the group consisting of

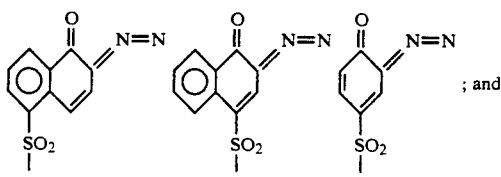
; and n is 2 or 3.

14. A photosensitive electrodeposition composition as claimed in claim 13, wherein said photosensitive quinone diazide compound is is a reaction product of the following compounds:

a polyisocyanate;

an aminophenoic compounds of the following formula:

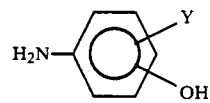

wherein Y is —H, —OH, alkyl, —COOH, nitro or halogen; and 1.2-quinone-diazide sulfonyl halide; wherein the equivalent ratio of the isocyanate to the amino groups of the amino phenoic compounds is 1:0.95–1, and the equivalent ratio of the hydroxy group of the amino phenoic compounds to the 1,2-quinone diazide sulfonyl halide is 1:0.2–1.

15. A photosensitive electrodeposition composition as claimed in claim 14, wherein said polyisocyanate is a reaction product of the following compounds:

a polyhydroxy compound having a hydroxy equivalent of 50–500 gram/hydroxy equivalent; and a diisocyanate;

wherein the equivalent ratio of the hydroxy group of said polyhydroxy compound to said diisocyanate is 1:1–1.25.

16. A photosensitive electrodeposition composition as claimed in claim 13, wherein the weight ratio of said acrylic resin to said photosensitive quinone diazide compound is 1:0.2–0.83.

* * * * *